United States Patent
Wei et al.

(10) Patent No.: US 10,826,527 B2
(45) Date of Patent: Nov. 3, 2020

(54) METHOD AND APPARATUS FOR DATA COMPRESSION AND DECOMPRESSION, AND DISPLAY APPARATUS

(71) Applicants: Hefei Xinsheng Optoelectronics Technology Co., Ltd., Hefei (CN); BOE TECHNOLOGY GROUP CO., LTD., Beijing (CN)

(72) Inventors: Xiaolong Wei, Beijing (CN); Yongqian Li, Beijing (CN); Fei Yang, Beijing (CN)

(73) Assignees: Hefei Xinsheng Optoelectronics Technology Co., Ltd., Hefei (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/515,959

(22) Filed: Jul. 18, 2019

(65) Prior Publication Data
US 2020/0036390 A1    Jan. 30, 2020

(30) Foreign Application Priority Data
Jul. 27, 2018   (CN) .......................... 2018 1 0846407

(51) Int. Cl.
*H03M 7/00*   (2006.01)
*H03M 7/30*   (2006.01)
(Continued)

(52) U.S. Cl.
CPC ....... *H03M 7/6041* (2013.01); *H03M 7/3084* (2013.01); *H03M 7/6005* (2013.01); *H03M 7/6011* (2013.01); *G06T 7/223* (2017.01);
*H03M 7/00* (2013.01); *H04N 19/45* (2014.11); *H04N 19/463* (2014.11); *H04N 19/517* (2014.11)

(58) Field of Classification Search
CPC ....... H03M 7/00; G06T 7/223; H04N 19/463; H04N 19/517; H04N 19/45
USPC ...... 341/50, 51; 375/240.24, 240.26, 240.16, 375/240.18; 382/166
See application file for complete search history.

(56) References Cited

U.S. PATENT DOCUMENTS

| 5,675,666 A | * | 10/1997 | Komuro | ............... | H04N 19/527 |
| | | | | | 375/240.24 |
| 2010/0142622 A1 | * | 6/2010 | Le Leannec | ........... | H04N 19/10 |
| | | | | | 375/240.16 |

(Continued)

FOREIGN PATENT DOCUMENTS

| CN | 101089940 | 12/2007 |
| CN | 103761933 | 4/2014 |

(Continued)

OTHER PUBLICATIONS

Office Action dated Sep. 3, 2019 for Chinese Patent Application No. 201810849407.4.

(Continued)

*Primary Examiner* — Joseph J Lauture
(74) *Attorney, Agent, or Firm* — Thomas | Horstemeyer LLP

(57) ABSTRACT

A method for data compression includes acquiring compensation data, comparing the compensation data with preset base value data to obtain a compensation data deviation, and performing an encoding compression on the compensation data deviation to obtain compressed data.

15 Claims, 4 Drawing Sheets

(51) Int. Cl.
H04N 19/463 (2014.01)
G06T 7/223 (2017.01)
H04N 19/517 (2014.01)
H04N 19/44 (2014.01)

(56) References Cited

U.S. PATENT DOCUMENTS

2013/0033464 A1   2/2013   Choi et al.
2017/0077956 A1*  3/2017   Hamada ............ H03M 13/2906

FOREIGN PATENT DOCUMENTS

| | | |
|---|---|---|
| CN | 104751794 | 7/2015 |
| CN | 104954797 | 9/2015 |
| CN | 105448263 | 3/2016 |
| CN | 105679269 | 6/2016 |
| CN | 106328062 | 1/2017 |
| CN | 106991965 | 7/2017 |
| CN | 107342064 | 11/2017 |
| CN | 206946907 | 1/2018 |
| CN | 107799065 | 3/2018 |
| CN | 107799069 | 3/2018 |
| CN | 108133947 | 6/2018 |

OTHER PUBLICATIONS

2nd Office Action dated Apr. 10, 2020 for Chinese Patent Application No. 201810849407.4.

\* cited by examiner

METHOD AND APPARATUS FOR DATA COMPRESSION AND DECOMPRESSION, AND DISPLAY APPARATUS

CROSS-REFERENCE TO RELATED APPLICATION

This application is based upon, claims the benefit of, and claims priority to Chinese Patent Application No. 201810846407.4, filed on Jul. 27, 2018, the entire contents thereof being incorporated by reference herein.

TECHNICAL FIELD

The present disclosure relates to the field of compression and decompression technologies and, more particularly, to a method and an apparatus for data compression and decompression, and a display apparatus.

BACKGROUND

Drive thin film transistors (TFTs) of OLED display panels have inconsistent electrical characteristics due to process conditions and the like, which has a negative effect on brightness uniformity of the panels. According to OLED external compensation technologies, compensation data is obtained by detecting characteristic parameters of the drive TFTs of each pixel, and driving voltages are corrected. In this way, the problem of brightness inconsistency caused by the inconsistent TFT electrical characteristics is solved.

Presently, data capacity of the compensation data of the OLED display panels is larger, high bandwidth is required in the process of reading and writing operations, and a larger storage capacity is required for storage, which results in an increase in cost of display panel controllers.

It is to be noted that the above information disclosed in this Background section is only for enhancement of understanding of the background of the present disclosure, and therefore, it may contain information that does not form the related art or is already known to a person of ordinary skill in the art.

SUMMARY

An objective of the present disclosure is to provide a method and an apparatus for data compression and decompression, and a display apparatus.

According to a first aspect of the present disclosure, there is provided a method for data compression, which includes:
acquiring compensation data;
comparing the compensation data with preset base value data to obtain a compensation data deviation; and
performing an encoding compression on the compensation data deviation to obtain compressed data.

According to an embodiment of the present disclosure, comparing the compensation data with preset base value data includes:
acquiring the preset base value data; and
performing a subtraction operation between the compensation data and the preset base value data.

According to an embodiment of the present disclosure, acquiring the preset base value data includes:
selecting, from the compensation data, compensation data of a second column adjacent to compensation data of a first column as the preset base value data of the compensation data of the first column.

According to an embodiment of the present disclosure, acquiring the preset base value data includes:
obtaining the preset base value data of first compensation data based on a linear combination of at least second compensation data among the compensation data.

According to an embodiment of the present disclosure, after the performing the encoding compression on the compensation data deviation, the method further includes:
storing the compressed data and initial preset base value data, the initial preset base value data being a first acquired column of the preset base value data.

According to an embodiment of the present disclosure, the compensation data include: compensation data of a threshold voltage Vth driving a thin film transistor (TFT) and/or compensation data of an electron mobility K.

According to a second aspect of the present disclosure, there is provided a method for data decompression, which includes:
acquiring compressed data, the compressed data including a compensation data deviation obtained after encoding compression;
decoding the compressed data to obtain the compensation data deviation; and
calculating compensation data based on the compensation data deviation and preset base value data.

According to a third aspect of the present disclosure, there is provided an apparatus for data compression, which includes:
a first reader, coupled to an external memory and configured to acquire compensation data;
a comparator, coupled to the first reader and configured to compare the compensation data with preset base value data to acquire a compensation data deviation; and
an encoder, coupled to the comparator and configured to perform encoding compression on the compensation data deviation to obtain compressed data.

According to a fourth aspect of the present disclosure, there is provided an apparatus for data decompression, which includes:
a second reader, coupled to an external memory and configured to acquire compressed data, the compressed data including a compensation data deviation obtained after the encoding compression;
a decoder, coupled to the second reader and configured to decode the compressed data to obtain the compensation data deviation; and
a calculation unit, coupled to the decoder and configured to calculate compensation data based on the compensation data deviation and the preset base value data.

According to a fifth aspect of the present disclosure, there is provided a display apparatus, which includes: an apparatus for data compression and/or an apparatus for data decompression.

It is to be understood that the above general description and the detailed description below are merely exemplary and explanatory, and do not limit the present disclosure.

BRIEF DESCRIPTION OF THE DRAWINGS

The above and other features and advantages of the present disclosure will become more apparent by describing in detail the exemplary embodiments thereof with reference to the accompanying drawings.

DETAILED DESCRIPTION

Figure 1:
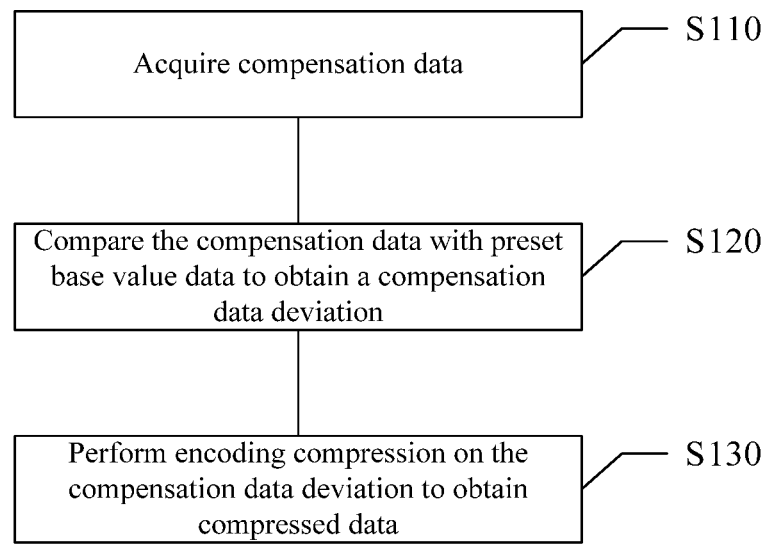
FIG. 1 is a flowchart of a method for data compression according to an exemplary embodiment of the present disclosure.

The exemplary embodiment will now be described more fully with reference to the accompanying drawings. However, the exemplary embodiments can be implemented in a variety of forms and should not be construed as limited to the embodiments set forth herein. Rather, the embodiments are provided so that this disclosure will be thorough and complete and will fully convey the concepts of exemplary embodiments to those skilled in the art. The same reference numerals in the drawings denote the same or similar parts, and thus, repeated descriptions thereof will be omitted.

In addition, the features, structures, or characteristics described may be combined in one or more embodiments in any suitable manner. In the following description, numerous specific details are provided to give a full understanding of the embodiments of the present disclosure. However, those skilled in the art will appreciate that one or more of the specific details may be practiced without practicing the technical solutions of the present disclosure, and other methods, components, materials, devices, steps, and the like may be employed. In other instances, well-known structures, methods, devices, implementations, materials, or operations are not shown or described in detail to avoid obscuring aspects of the present disclosure.

The block diagrams illustrated in the drawings are merely functional entities and do not necessarily correspond to any physically or logically separate entity. That is, these functional entities may be implemented in software form, or these functional entities, or a part of these functional entities may be implemented in one or more software hardening modules, or these functional entities may be implemented in different networks and/or processor apparatuses and/or microcontroller apparatuses.

An embodiment of the present disclosure first provides a method for data compression, which may be used in a compression of display panel drive compensation data, for example, compression of OLED display panel TFT drive compensation data. Referring to FIG. 1, the method for data compression includes following steps:

Step S110: acquiring compensation data;

Step S120: comparing the compensation data with preset base value data to obtain a compensation data deviation; and Step S130: performing encoding compression on the compensation data deviation to obtain compressed data.

According to the method for data compression provided by an exemplary embodiment of the present disclosure, after the compensation data of the display panel is acquired, the compensation data deviation is obtained by comparing the compensation data with the preset base value data, and then, an encoding compression is performed on the compensation data deviation. Because of stronger correlation between the compensation data, the number of bytes of the compensation data deviation is less than the compensation data, and thus, a storage capacity required for storing the compressed data is reduced, a bandwidth required for transmitting the compressed data is reduced, and costs of the display panel are lowered. No damage is caused to the compensation data in the compression process.

The method for data compression in this exemplary embodiment will be further described below.

In Step S110, the compensation data may be acquired.

Each pixel of an OLED display panel controls a driving current flowing into an OLED by a drive TFT to control a light emission brightness of the OLED. Electrical characteristics of the OLED display panel are inconsistent due to TFT drive process conditions and the like. In order not to have a negative effect on a display effect of the display panel, characteristic parameters of the drive TFT corresponding to each pixel are detected using external compensation technologies to obtain compensation data.

Figure 2:
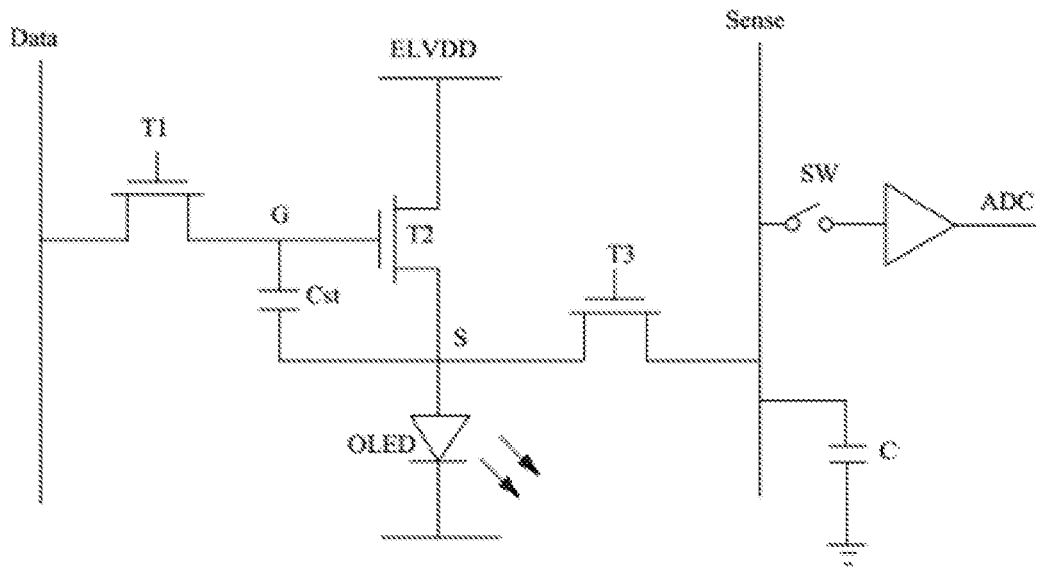
FIG. 2 is a circuit diagram for detection of compensation data according to an exemplary embodiment of the present disclosure.
Figure 3:
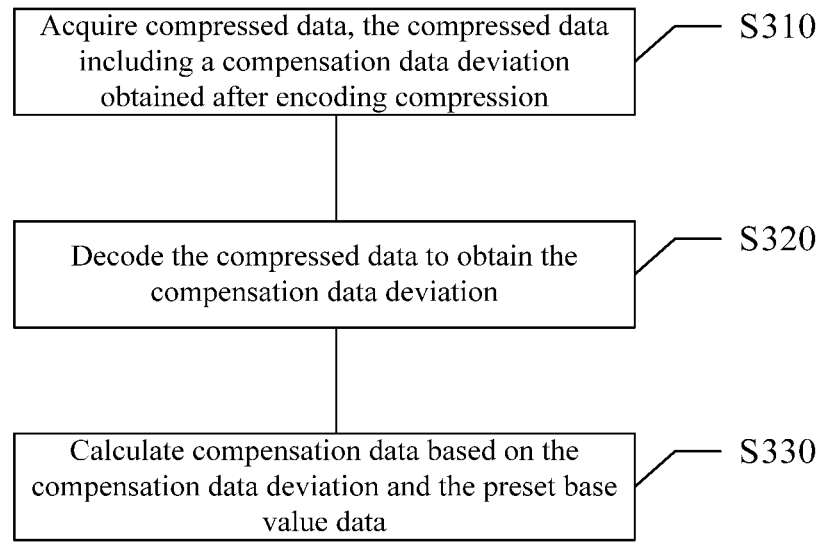
FIG. 3 is a flowchart of a method for data decompression according to an exemplary embodiment of the present disclosure.

As an example, the compensation data may include a threshold voltage Vth and an electron mobility K of the drive TFT. In the related art, the C capacitor voltage is obtained through sampling using the circuit shown in FIG. 2, wherein T2 represents the drive TFT. The C capacitor voltage is detected using a detection circuit on the right of the T2. The compensation data of the Vth and the compensation data of the K are calculated using a related TFT model. Of course, in practical application, the compensation data may further include other compensation data, such as optical compensation data, but embodiments of the present disclosure are not limited thereto.

In Step S120, the compensation data may be compared with preset base value data to obtain a compensation data deviation.

Comparing the compensation data with the preset base value data may include:

acquiring the preset base value data; and performing a subtraction operation on the compensation data and the preset base value data.

In a first implementation provided by the embodiments of the present disclosure, the preset base value data may be acquired as follows: in the compensation data, compensation data of a column adjacent to compensation data of a current column are selected as the preset base value data of the compensation data of the current column.

In the display panel, pixels are arranged in an array. After compensation data corresponding to each pixel is acquired, the compensation data is arranged according to a location of the pixel corresponding to the compensation data. In the compensation data, compensation data of a column adjacent to compensation data of a current column are selected as the preset base value data of the compensation data of the current column, and then, the preset base value data is subtracted from the data of the current column to obtain a column of compensation data deviation.

For example, Table 1 shows the compensation data of a set of threshold voltages Vth of the display panel. The compensation data of Vth in the left column of the current column is sequentially selected as the preset base value data of the compensation data of the current column Vth. That is, from the left side, the compensation data deviation of the Vth is obtained by subtracting the data of a column adjacent to the left side from the data of the current column, as shown in Table 2.

TABLE 1

Compensation data of a set of Vth of the display panel

| 163 | 166 | 165 | 165 | 167 |
|-----|-----|-----|-----|-----|
| 172 | 163 | 167 | 155 | 164 |
| 173 | 167 | 165 | 163 | 166 |
| 160 | 163 | 163 | 165 | 162 |

TABLE 2

Compensation data deviation of a set of Vth of the display panel

| 3  | −1 | 0   | 2  |
|----|----|-----|----|
| −9 | 4  | −12 | 9  |
| −6 | −2 | −2  | 3  |
| 3  | 0  | 2   | −3 |

Similarly, for the compensation data of a set of electron mobilities K of the display panel as shown in Table 3, the compensation data of the K in the left column of the current column is selected as the base value data of the compensation data of the K of the current column, and a compensation data deviation of the K is obtained by subtracting the data of a column adjacent to the left side from the data of the current column, as shown in Table 4.

TABLE 3

Compensation data of a set of K of the display panel

| 125 | 125 | 122 | 120 | 122 |
|-----|-----|-----|-----|-----|
| 130 | 126 | 125 | 123 | 123 |
| 127 | 126 | 126 | 121 | 122 |
| 122 | 125 | 121 | 124 | 120 |

TABLE 4

Compensation data deviation of a set of K of the display panel

| 0  | −3 | −2 | 2  |
|----|----|----|----|
| −4 | −1 | −2 | 0  |
| −1 | 0  | −5 | 1  |
| 3  | −4 | 3  | −4 |

Of course, in practical applications, the compensation data in the right column of the current column may be sequentially selected as the preset base value data. That is, the compensation data deviation is sequentially calculated from the right side. Alternatively, the compensation data deviation is calculated in units of rows in the compensation data matrix. In this case, compensation data of a row adjacent to compensation data of a current row is selected as the preset base value data of the compensation data of the current row, which is not specifically limited in the embodiments of the present disclosure.

In a second implementation provided by the embodiments of the present disclosure, the preset base value data may be acquired as follows: in the compensation data, the preset base value data of current compensation data is obtained by a linear combination of at least one compensation datum among the compensation data. The preset base value data may be calculated based on the following formula:

$$\hat{f}_n = \text{round} \sum_{i=1}^{m} a_i f_m$$

wherein $\hat{f}_n$ represents the preset base value data, $a_i$ represents a designated coefficient, $f_m$ represents the compensation data, and round represents a rounding function.

For example, the linear combination of the compensation data prior to one or more current compensation data may be used as the preset base value data of the current compensation data; or the preset base value data may be the expectation of all the compensation data.

Of course, in actual applications, one datum may be selected as the preset base value data of all the compensation data. For example, a mode of all the base value data may be selected as the preset base value data, or a certain datum may be designated as the preset base value data empirically, which is not specifically limited in the embodiments of the present disclosure.

After the preset base value data is acquired, a subtraction operation is performed on the compensation data and the preset base value data to obtain a compensation data deviation. The compensation data deviation may be obtained by subtracting the preset base value data from the compensation data, or the compensation data deviation may be obtained by subtracting the compensation data from the preset base value data.

In Step S130, encoding compression may be performed on the compensation data deviation to obtain compressed data.

When performing the encoding compression, the encoding may include encoding of data of equal length, or may include encoding of data of unequal length, such as Huffman encoding.

It is to be noted that when the encoding compression is performed on the compensation data deviation, the preset base value data may be encoded simultaneously. When the preset base value data is encoded, if the preset base value is a certain value, for example, if the preset base value data are expectations or modes of the compensation data or designated values determined empirically, the preset base value data is encoded. If the preset base value data is dynamic data, for example, if compensation data of a column adjacent to compensation data of a current column is selected, from a compensation data matrix, as the preset base value data of the compensation data of the current column, initial preset base value data is encoded. The initial preset base value data may be data of the leftmost column or the rightmost column in the compensation data matrix. When the preset base value data of the compensation data of the current column is obtained by a linear combination of at least one compensation datum among the compensation data, the initial preset base value data may be the at least one datum adjacent to the current compensation data. The preset base value data may be encoded at this moment.

Further, after performing encoding compression on the compensation data deviation, the method for data compression provided by the embodiments of the present disclosure may also include storing the compressed data.

The compressed data may be stored in an external memory cell. The compressed data include the compensation data deviation and initial preset base value data. If the preset base value data is at certain values, for example, if the preset base value data is expectations or modes of the compensation data or designated values determined empirically, the preset base value data is compressed. If the preset base value data is dynamic data, for example, if compensation data of a column adjacent to compensation data of a current column is selected, from a compensation data matrix, as the preset base value data of the compensation data of the current column, initial preset base value data is encoded. The initial preset base value data may be data of the leftmost column or the rightmost column in the compensation data matrix.

An embodiment of the present disclosure further provides a method for data decompression, which is used for decompressing the compressed data obtained using the above method for data compression. The method for data decompression includes:

Step S310: acquiring compressed data, the compressed data including a compensation data deviation obtained after an encoding compression;

Step S320: decoding the compressed data to obtain the compensation data deviation; and Step S330: calculating the display panel drive compensation data based on the compensation data deviation and the preset base value data.

According to the method for data decompression provided by the embodiments of the present disclosure, after compressed data is acquired, the compressed data is decompressed to obtain a compensation data deviation. Compensation data is obtained based on the preset base value data and the compensation data deviation. No damage is caused to data in the entire decompression process. It is ensured that storage space and transmission bandwidth required for the compensation data is reduced when the compensation data is compressed using the method for data compression provided by the embodiments of the present disclosure and, also, it is ensured that the decompressed compensation data satisfy compensation requirements for TFT driving.

The method for data compression in this exemplary embodiment will be further described below.

In Step S310, compressed data may be acquired, wherein the compressed data include a compensation data deviation obtained after encoding compression.

The method for data decompression provided by the embodiments of the present disclosure may be regarded as an inverse process of the above method for data compression. During decompression, the compressed data compressed using the above method for data compression is first acquired, wherein the compressed data include the compensation data deviation obtained after encoding compression.

In Step S320, the compressed data may be decoded to obtain the compensation data deviation.

When decoding the compressed data, the compressed data is decoded according to an encoding rules to obtain the compensation data deviation. In the meantime, the preset base value data may also be decoded. The preset base value data mentioned herein is the determined preset base value data when the preset value data are determined data, or the initial preset base value data when the preset base value data is dynamic data.

In Step S330, the compensation data may be calculated based on the compensation data deviation and the preset base value data.

The calculation mode of the display panel drive compensation data is determined by the calculation mode of the compensation data deviation during compression. If the compensation data deviation during compression is obtained by subtracting the preset base value data from the compressed compensation data, the compensation data may be the sum of the preset base value data and the compensation data deviation. If the compensation data deviation during compression is obtained by subtracting the compensation data from the preset base value data, the compensation data may be the differential between the preset base value data and the compensation data deviation.

When the preset base value data is the determined data, for example, when the preset base value data is expectations or modes of the compensation data or designated values determined empirically, the compensation data is directly obtained by calculating based on the preset base value data and the compensation data deviation. When the preset base value data is dynamic data, for example, if compensation data of a column adjacent to compensation data of a current column is selected from a compensation data matrix as the preset base value data of the compensation data of the current column, initial preset base value data is first acquired. The compensation data of the column adjacent to the preset base value data is calculated based on the preset base value data and the compensation data deviation corresponding to the preset base value data, then, the compensation data of the column serves as preset base value data to be calculated subsequently thereafter, and so on. In this way, all compensation data is calculated.

As an example, when decompressing the compensation data deviation of Vth as shown in Table 2, the stored compensation data deviation in Table 2 and the initial preset base value data (i.e., the data in the first column in Table 1) is acquired, and the data in the first column in Table 1 and the data in the first column in Table 2 are summed to obtain the data in the second column in Table 1, and so on. In this way, all the compensation data in Table 1 is obtained.

It is to be noted that, steps of the method in the present disclosure are described in a particular order in the accompanying drawings. However, this does not require or imply to execute these steps necessarily according to the particular order, or this does not mean that the expected result cannot be implemented unless all the shown steps are executed. Additionally or alternatively, some steps may be omitted, a plurality of steps may be combined into one step for execution, and/or one step may be decomposed into a plurality of steps for execution.

Figure 4:
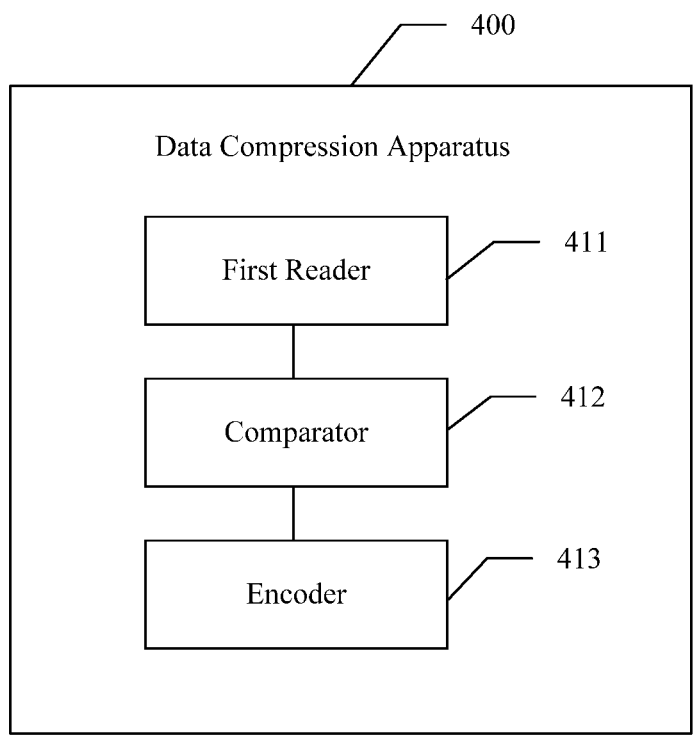
FIG. 4 is a block diagram of an apparatus for data compression according to an exemplary embodiment of the present disclosure.

In addition, in this exemplary embodiment, an apparatus 400 for data compression is further provided. Referring to FIG. 4, the apparatus 400 for data compression includes:

a first reader 411 coupled to an external memory, and configured to acquire compensation data;

a comparator 412 coupled to the first reader 411, and configured to compare the compensation data with preset base value data to acquire a compensation data deviation; and an encoder 413 coupled to the comparator 412, and configured to perform encoding compression on the compensation data deviation to obtain compressed data.

The apparatus 400 for data compression may be an apparatus, such as a timing sequence controller, which may be an FPGA, GPU, ASIC, etc.

Figure 8:
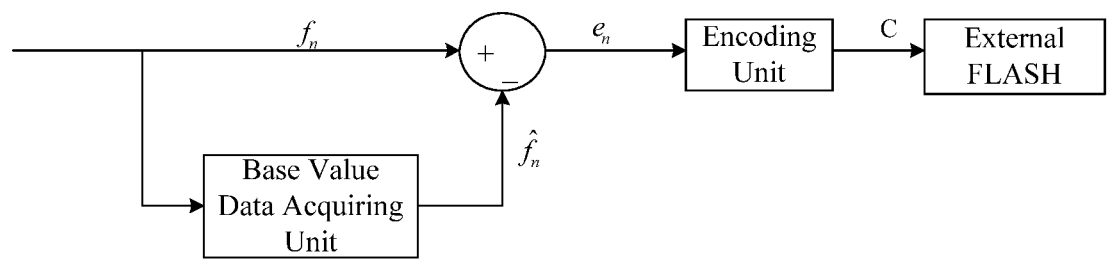
FIG. 8 is a schematic diagram of a data compression process according to an exemplary embodiment of the present disclosure.

As an example, a working process of the apparatus for data compression provided by the embodiments of the present disclosure is as shown in FIG. 8. Specifically, after compensation data $f_n$ is acquired, the compensation data $f_n$ is inputted and then is compared using the comparator. A subtraction operation is performed on the compensation data $f_n$ and the preset base value data $\hat{f}_n$ to obtain a compensation data deviation $e_n$. Encoding compression is performed on the compensation data deviation $e_n$ using an encoding unit, and the compressed compensation data C is stored in memory, such as an external FLASH.

According to the apparatus for data compression provided by an exemplary embodiment of the present disclosure, after the compensation data of the display panel is acquired, the compensation data deviation is obtained by comparing the compensation data with the preset base value data, and then, an encoding compression is performed on the compensation data deviation. Because of a stronger correlation between the compensation data, the number of bytes of the compensation data deviation is less than the compensation data, and thus, a storage capacity required for storing the compressed data is reduced, a bandwidth required for transmitting the compressed data is reduced, and costs of the display panel are lowered.

The specific details of each module in the above apparatus for data compression have been described in detail in the corresponding method for data compression and therefore, will not be described herein.

Figure 5:
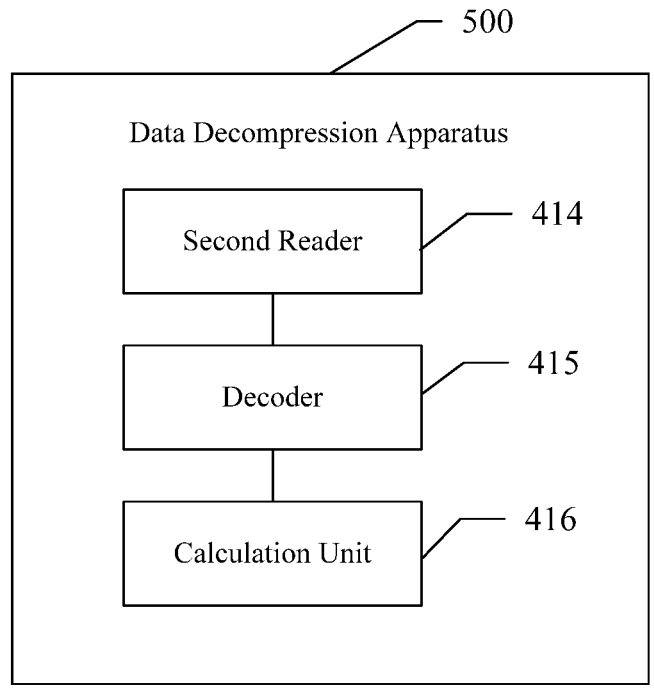
FIG. 5 is a block diagram of an apparatus for data decompression according to an exemplary embodiment of the present disclosure.

In addition, in this exemplary embodiment, an apparatus 500 for data decompression is further provided. Referring to FIG. 5, the apparatus 500 for data decompression is illustrated.

According to a fourth aspect of the present disclosure, an apparatus for data decompression is provided, which includes:

a second reader 414 coupled to an external memory, and configured to acquire compressed data, the compressed data including a compensation data deviation obtained after encoding compression;

a decoder 415 coupled to the second reader 414, and configured to decode the compressed data to obtain the compensation data deviation; and a calculation unit 416 coupled to the decoder, and configured to calculate compensation data based on the compensation data deviation and preset base value data.

The apparatus 500 for data decompression may be an apparatus such as a timing sequence controller, which may be an FPGA, GPU, ASIC, etc.

Figure 9:
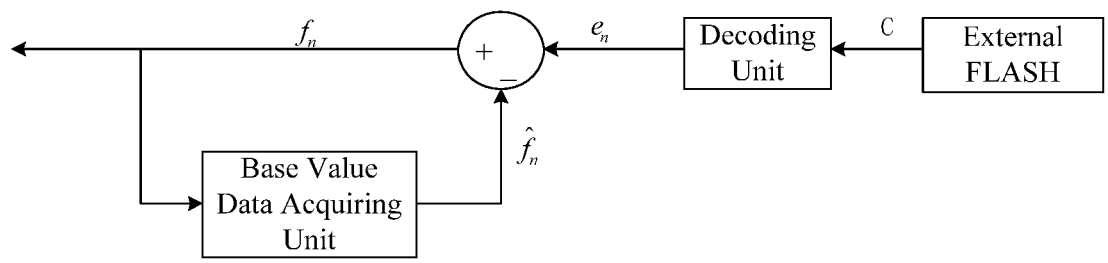
FIG. 9 is a schematic diagram of a data decompression process according to an exemplary embodiment of the present disclosure.

As an example, the working process of the apparatus for data decompression provided by the embodiments of the present disclosure is as shown in FIG. 9. Specifically, after the compressed compensation data C is acquired from the external FLASH, the compressed compensation data C is decoded using a decoding unit to obtain a compensation data deviation $e_n$, and an operation is performed on the compensation data deviation $e_n$ and base value data $\hat{f}_n$ to obtain compensation data $f_n$.

According to the apparatus for data decompression provided by the embodiments of the present disclosure, after compressed data is acquired, the compressed data is decompressed to obtain a compensation data deviation. Compensation data is obtained based on the preset base value data and the compensation data deviation. No damage is caused to the data in the entire decompression process. It is ensured that storage space and transmission bandwidth required for the compensation data is reduced when the compensation data is compressed using the method for data compression provided by the embodiments of the present disclosure, and also it is ensured that the decompressed compensation data satisfy compensation requirements for TFT driving.

The specific details of each module in the above apparatus for data decompression have been described in detail in the corresponding method for data decompression and therefore, will not be described herein.

It is to be noted that although a plurality of modules or units of the apparatus for data compression and the apparatus for data decompression have been mentioned in the above detailed description, this partition is not compulsory. Actually, according to the embodiment of the present disclosure, features and functions of two or more modules or units as described above may be embodied in one module or unit. Reversely, features and functions of one module or unit as described above may be further embodied in more modules or units.

Figure 6:
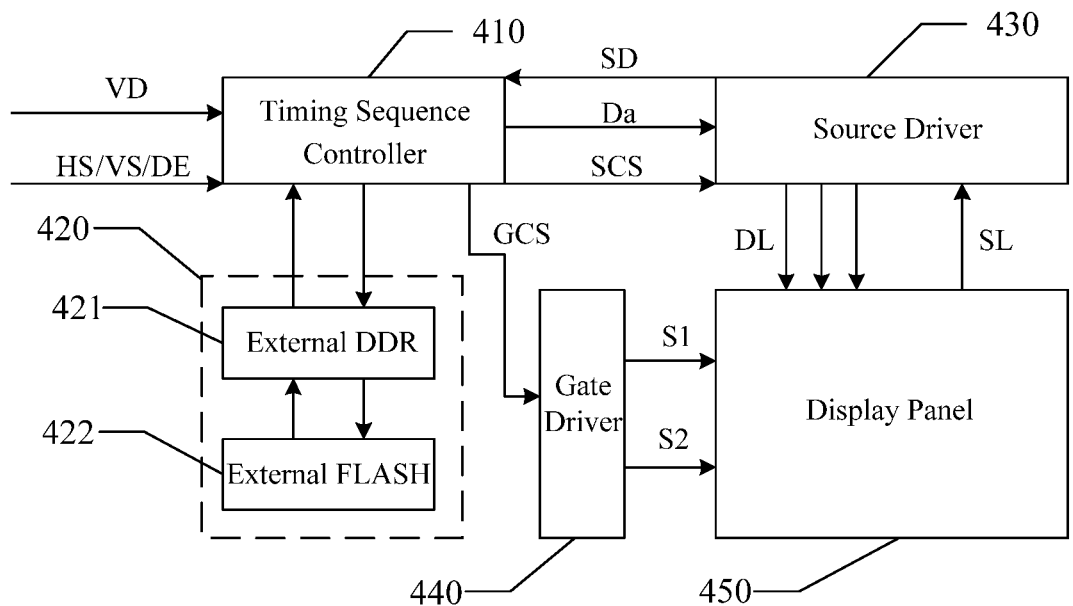
FIG. 6 is a block diagram of an electronic device according to an exemplary embodiment of the present disclosure.

In addition, in an exemplary embodiment of the present disclosure, a display apparatus is provided, which includes the apparatus for data compression and/or the apparatus for data decompression provided by the embodiment of the present disclosure. As shown in FIG. 6, the display apparatus may further include: an external memory 420, a gate driver 440, a source driver 430, and a display panel 450. The external memory 420 may include an external DDR 421 and an external FLASH 422. Both the apparatus for data compression and the apparatus for data decompression are timing sequence controllers 410, which may be either the same timing sequence controller 410 or different timing sequence controllers 410, in practical applications. In some embodiments of the present disclosure, reference is made taking the same timing sequence controller 410 as an example.

The timing sequence controller 410 receives sense data SD in a pixel outputted by the source driver 430, compresses the data after conversion, calculation, compensation, and so on, and stores the data in the external memory 420. The timing sequence controller 410 receives externally inputted video data VD and a timing sequence control signal HS/VS/DE, and synchronously reads the compensation data stored in the external memory 420, which is decompressed and used for compensation display. In the running period of the display apparatus, the timing sequence controller 410 generates display data Data and a source control signal SCS, and outputs the source control signal SCS to the source driver 430. The timing sequence controller generates a gate control signal GCS, outputs the gate control signal GCS to the gate driver 440, and finally controls normal picture output. In the blanking period of the display apparatus, the timing sequence controller 410 generates the sense data Da and the source control signal SCS, and outputs the source control signal SCS to the source driver 430. The timing sequence controller generates the gate control signal GCS, and outputs the gate control signal GCS to the gate driver 440. The sense data SD is obtained under the cooperation of the gate driver 440 and the source driver 430. The sense data SD may include the compensation data.

The external memory 420 may store variation or a variation curve of the electron mobility K and the threshold voltage Vth of each sub-pixel based on temperature variation. The stored data may also include characteristic values of different drive TFTs, such as the threshold voltage Vth, and the mobility K, etc. Furthermore, the stored data may also include characteristic values of different OLED devices, such as the threshold voltage Voled. Moreover, the stored data may also include characteristic values of different TFTs and optical compensation characteristic values of different OLED devices.

The source driver 430 receives the data Da and the source control signal SCS, generates a corresponding data voltage, and outputs the data voltage to the display panel 450 through a data line DL. Under the control of the source driver 430 and the gate driver 440, in the blanking period of display, the source driver 430 senses optical/electrical characteristic values of a pixel through the data line DL, generates corresponding sense data SD, and outputs the sense data SD to the timing sequence controller 410. The gate driver 440 receives the gate control signal GCS, generates a corresponding Gate signal, and outputs the Gate signal to the display panel 450 via a GL signal.

In an exemplary embodiment of the present disclosure, a non-transitory computer-readable storage medium storing a program product capable of implementing the above method in the specification is provided. In some possible embodiments, aspects of the present disclosure may be implemented as a form of a program product, which includes program code executable in at least one hardware processor. When the program product runs on the terminal device, the program code is used for enabling the terminal device to perform the steps described in the above exemplary method portions of this specification according to the exemplary embodiments of the present disclosure.

Figure 7:
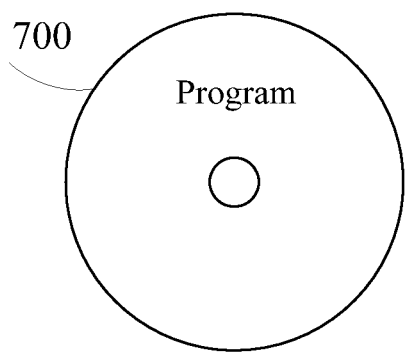
FIG. 7 is a schematic diagram of a computer-readable storage medium according to an exemplary embodiment of the present disclosure.

Referring to FIG. 7, a program product 700 configured to implement the above method is described according to the embodiments of the present disclosure. The program product 700 may adopt a portable compact disc read-only memory (CD-ROM) and include a program code, and may run on a terminal device, such as a personal computer. However, the program product of the present disclosure is not limited thereto. In this document, a readable storage medium may be any tangible medium that can contain or store a program for use by or in connection with an instruction execution system, apparatus, or device.

Any combination of one or more readable medium(s) may be utilized by the program product. The readable medium may be a readable signal medium or a readable storage medium. The readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the readable storage medium include the following: an electrical connection having one or more wires, a portable diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing.

A computer readable signal medium may include a propagated data signal with readable program code embodied therein, for example, in baseband or as part of a carrier wave. Such a propagated data signal may take any of a variety of forms, including, but not limited to, electro-magnetic, optical, or any suitable combination thereof. A readable signal medium may be any readable medium that is not a readable storage medium and that can communicate, propagate, or transport a program for use by or in connection with an instruction execution system, apparatus, or device.

Program code embodied on a readable medium may be transmitted using any appropriate medium, including but not limited to wireless, wireline, optical fiber cable, RF, etc., or any suitable combination of the foregoing.

Program code for carrying out operations of the present disclosure may be written in any combination of one or more programming languages, including an object-oriented programming language such as Java, C++ or the like and conventional procedural programming languages, such as the "C" programming language or similar programming languages. The program code may execute entirely on the user's computing device, partly on the user's computing device, as a stand-alone software package, partly on the user's computing device and partly on a remote computing device or entirely on the remote computing device or server. In the latter scenario, the remote computing device may be coupled to the user's computing device through any type of network, including a local area network (LAN) or a wide area network (WAN), or may be coupled to an external computing device (for example, through the Internet using an Internet Service Provider).

Moreover, the above accompanying drawings are merely illustrative description of processes included in the method according to the exemplary embodiments of the present disclosure and are not intended to limit the present disclosure. Understandably, the processes shown in the above accompanying drawings do not indicate or limit time sequences of these processes. Furthermore, understandably, these processes may be executed, for example, synchronously or asynchronously in a plurality of modules.

Other embodiments of the present disclosure will be apparent to those skilled in the art from consideration of the specification and practice of the present disclosure disclosed here. This application is intended to cover any variations, uses, or adaptations of the present disclosure following the general principles thereof and include such departures from the present disclosure as become known or customary practice in the art. It is intended that the specification and embodiments be considered as exemplary only, with a true scope and spirit of the present disclosure being indicated by the following claims. It will be appreciated that the present disclosure is not limited to the exact construction that has been described above and illustrated in the accompanying drawings, and various modifications and changes can be made without departing from the scope thereof. It is intended that the scope of the present disclosure only be limited by the appended claims.

What is claimed is:

1. A method for data compression, comprising:
   acquiring compensation data;
   comparing the compensation data with preset base value data to obtain a compensation data deviation, wherein comparing the compensation data with the preset base value data comprises:
      selecting, from the compensation data, compensation data of a second column adjacent to compensation data of a first column as the preset base value data of the compensation data of the first column; or
      obtaining the preset base value data of first compensation data based on a linear combination of at least second compensation data among the compensation data; and
   performing an encoding compression on the compensation data deviation to obtain compressed data.

2. The method for data compression according to claim 1, wherein comparing the compensation data with the preset base value data further comprises performing a subtraction operation between the compensation data and the preset base value data.

3. The method for data compression according to claim 1, wherein, after performing the encoding compression on the compensation data deviation, the method further comprises: storing the compressed data and initial preset base value data, the initial preset base value data being a first acquired column of the preset base value data.

4. The method for data compression according to claim 1, wherein the compensation data comprise at least one of:
   compensation data of a threshold voltage Vth driving a thin film transistor (TFT); or
   compensation data of an electron mobility K.

5. A method for data decompression, comprising:
acquiring compressed data, the compressed data comprising a compensation data deviation obtained after encoding compression;
decoding the compressed data to obtain the compensation data deviation; and
calculating compensation data based on the compensation data deviation and preset base value data, wherein calculating the compensation data based on the compensation data deviation and the preset base value data comprises determining a calculation mode of the compensation data based on a calculation mode of the compensation data deviation during compression.

6. The method for data decompression according to claim 5, wherein calculating the compensation data based on the compensation data deviation and the preset base value data further comprises at least one of:
calculating the compensation data as a sum of the preset base value data and the compensation data deviation, in response to determining that the compensation data deviation during a compression is obtained by subtracting the preset base value data from the compressed data; and
calculating the compensation data as a difference between the preset base value data and the compensation data deviation, in response to determining that the compensation data deviation during compression is obtained by subtracting the compensation data from the preset base value data.

7. The method for data decompression according to claim 5, wherein calculating the compensation data based on the compensation data deviation and the preset base value data further comprises:
acquiring an initial preset base value data in response to determining that the preset base value data is dynamic data, the dynamic data comprising compensation data of a second column adjacent to compensation data of a first column is selected as the preset base value data of the compensation data of the first column; and
calculating the compensation data of the second column adjacent to the preset base value data based on the preset base value data and the compensation data deviation corresponding to the preset base value data, using the compensation data of the second column as the preset base value data corresponding to next time of calculating, until all the compensation data is calculated.

8. A display apparatus, comprising an apparatus for data compression, wherein the apparatus for data compression comprises:
a first reader coupled to an external memory, the first reader being configured to acquire compensation data;
a comparator coupled to the first reader, the comparator being configured to compare the compensation data with preset base value data to acquire a compensation data deviation; and
an encoder coupled to the comparator, the encoder being configured to perform an encoding compression on the compensation data deviation to obtain compressed data, wherein the comparator is further configured to:
select, from the compensation data, compensation data of a second column adjacent to compensation data of a first column as the preset base value data of the compensation data of the first column; or
obtain the preset base value data of first compensation data based on a linear combination of at least second compensation data among the compensation data.

9. The display apparatus according to claim 8, wherein the comparator is further configured to perform a subtraction operation between the compensation data and the preset base value data.

10. The display apparatus according to claim 8, the external memory is configured to store the compressed data and initial preset base value data, the initial preset base value data being a first acquired column of the preset base value data.

11. The display apparatus according to claim 8, wherein the compensation data comprise at least one of:
compensation data of a threshold voltage Vth driving a thin film transistor (TFT); and
compensation data of an electron mobility K.

12. The display apparatus according to claim 8, further comprising an apparatus for data decompression, wherein the apparatus for data decompression comprises:
a second reader coupled to an external memory, the second reader being configured to acquire compressed data, the compressed data comprising a compensation data deviation obtained after the encoding compression;
a decoder coupled to the second reader, the decoder being configured to decode the compressed data to obtain the compensation data deviation; and
a calculation unit coupled to the decoder, the calculation unit being configured to calculate compensation data based on the compensation data deviation and the preset base value data.

13. The display apparatus according to claim 12, wherein the calculation unit configured to calculate the compensation data based on the compensation data deviation and the preset base value data is configured to: determine a calculation mode of the compensation data based on the calculation mode of the compensation data deviation during compression.

14. The display apparatus according to claim 13, wherein the calculation unit configured to calculate the compensation data based on the compensation data deviation and the preset base value data is configured to perform at least one of:
calculating the compensation data as a sum of the preset base value data and the compensation data deviation, in response to determining that the compensation data deviation during the compression is obtained by subtracting the preset base value data from compressed compensation data; and
calculating the compensation data as a difference between the preset base value data and the compensation data deviation, in response to determining that the compensation data deviation during the compression is obtained by subtracting the compensation data from the preset base value data.

15. The display apparatus according to claim 12, wherein the calculation unit configured to calculate the compensation data based on the compensation data deviation and the preset base value data is configured to:
acquire an initial preset base value data in response to determining that the preset base value data is dynamic data, the dynamic data comprising compensation data of a second column adjacent to compensation data of a first column is selected as the preset base value data of the compensation data of the first column; and
calculate the compensation data of the second column adjacent to the preset base value data based on the preset base value data and the compensation data deviation corresponding to the preset base value data, using the compensation data of the second column as the preset base value data corresponding to next time of calculating, until all the compensation data has been calculated.

* * * * *